United States Patent
Bhat et al.

(10) Patent No.: US 10,642,615 B2
(45) Date of Patent: May 5, 2020

(54) SYSTEM AND METHOD FOR DYNAMIC ACCURACY AND THRESHOLD CONTROL FOR BRANCH CLASSIFICATION

(71) Applicant: International Business Machines Corporation, Armonk, NY (US)

(72) Inventors: Puneeth A. H. Bhat, Bangalore (IN); Satish Kumar Sadasivam, Erode (IN); Shruti Saxena, Kanpur (IN)

(73) Assignee: International Business Machines Corporation, Armonk, NY (US)

( * ) Notice: Subject to any disclaimer, the term of this patent is extended or adjusted under 35 U.S.C. 154(b) by 69 days.

(21) Appl. No.: 15/964,320

(22) Filed: Apr. 27, 2018

(65) Prior Publication Data

US 2019/0332380 A1    Oct. 31, 2019

(51) Int. Cl.
  *G06F 9/30*   (2018.01)
  *G06F 9/38*   (2018.01)

(52) U.S. Cl.
  CPC ........ *G06F 9/30058* (2013.01); *G06F 9/3804* (2013.01)

(58) Field of Classification Search
  None
  See application file for complete search history.

(56) References Cited

U.S. PATENT DOCUMENTS

| | | | | |
|---|---|---|---|---|
| 5,574,871 A | * | 11/1996 | Hoyt | G06F 9/3806 712/200 |
| 6,269,438 B1 | * | 7/2001 | Chang | G06F 8/4451 712/233 |
| 7,673,123 B2 | * | 3/2010 | Hastie | G06F 9/3844 712/239 |
| 2005/0235170 A1 | * | 10/2005 | Atkinson | G06F 1/3225 713/320 |
| 2013/0339683 A1 | * | 12/2013 | Bonanno | G06F 9/30 712/227 |
| 2014/0229721 A1 | | 8/2014 | Forsyth et al. | |
| 2015/0363201 A1 | | 12/2015 | Eickemeyer et al. | |

OTHER PUBLICATIONS

M.U. Farooq, "Improving Prediction Accuracy of Hard-to-Predict Branches using Data Value Correlation", dissertation, The University of Texas at Austin, Dec. 2013.

* cited by examiner

*Primary Examiner* — Eric Coleman
(74) *Attorney, Agent, or Firm* — Scully, Scott, Murphy & Presser, P.C.

(57) ABSTRACT

A processor comprising a processor pipeline comprising one or more execution units configured to execute branch instructions, a branch predictor associated with the processor pipeline and configured to predict a branch instruction outcome, a branch classification unit associated with the processor pipeline and the branch prediction unit. The branch classification unit is configured to, in response to detecting a branch instruction, classify the branch instruction as at least one of the following: a simple branch or a hard-to-predict (HTP) branch, wherein a threshold used for the classification is dynamically adjusted based on a workload of the processor.

20 Claims, 6 Drawing Sheets

SYSTEM AND METHOD FOR DYNAMIC ACCURACY AND THRESHOLD CONTROL FOR BRANCH CLASSIFICATION

BACKGROUND

The present invention relates to executions in a processor and more specifically to controlling the accuracy and stream threshold during classification of branches to increase the efficiency of a processor executing branch instructions.

Modern computer systems typically contain several integrated circuits (ICs), including a processor which may be used to process information in the computer system. The data processed by a processor may include computer instructions which are executed by the processor as well as data which is manipulated by the processor using the computer instructions. The computer instructions and data are typically stored in a main memory in the computer system.

Processors typically process instructions by executing the instruction in a series of small steps. In some cases, to increase the number of instructions being processed by the processor (and therefore increase the speed of the processor), the processor may be pipelined. Pipelining refers to providing separate stages in a processor where each stage performs one or more of the small steps necessary to execute an instruction, i.e., several instructions are overlapped in execution. In some cases, the pipeline (in addition to other circuitry) may be placed in a portion of the processor referred to as the processor core. Some processors may have multiple processor cores, and in some cases, each processor core may have multiple pipelines. Where a processor core has multiple pipelines, groups of instructions (referred to as issue groups) may be issued to the multiple pipelines in parallel and executed by each of the pipelines in parallel.

Branch instructions (or "branch") can be either unconditional, meaning that the branch is taken every time that the instruction is encountered in the program, or conditional, meaning that the branch is either taken or not taken, depending upon a condition. Processors typically provide conditional branch instructions which allow a computer program to branch from one instruction to a target instruction (thereby skipping intermediate instructions, if any) if a condition is satisfied. If the condition is not satisfied, the next instruction after the branch instruction may be executed without branching to the target instruction. Most often, the instructions to be executed following a conditional branch are not known with certainty until the condition upon which the branch depends has been resolved. These types of branches can significantly reduce the performance of a pipeline processor since they may interrupt the steady supply of instructions to the execution hardware. Branch predictors attempt to predict the outcome of conditional branch instructions in a program before the branch instruction is executed. If a branch is mispredicted, all of the speculative work, beyond the point in the program where the branch is encountered, must be discarded. Therefore, a highly-accurate branch prediction mechanism is beneficial to a high-performance, pipelined processor where branch prediction may be used to predict the outcome of conditional branch instructions. For example, when a conditional branch instruction is encountered, the processor may predict which instruction will be executed after the outcome of the branch condition is known. Then, instead of stalling the pipeline when the conditional branch instruction is issued, the processor may continue issuing instructions beginning with the predicted next instruction.

Many early implementations of branch predictors used simple history bits and counter-based schemes that provide branch prediction accuracy of about 85-90%. Attempts to improve upon the accuracy of simple 2-bit counter schemes have included predictors that relate the sub-history information of a branch to the most recently executed branches via a shift register. Among the methods used to predict branches are local branch prediction and global branch prediction. Local branch prediction involves making a prediction based on the behavior of a particular branch the past few times it was executed. Local branch prediction is effective for branches exhibiting repetitive patterns. On the other hand, global branch prediction involves making a branch prediction based on the history of the last few branches to have been executed. Global branch prediction is useful when the behavior of a branch is related to the behavior of the prior executed branches.

While history-based dynamic branch predictors have reached high prediction accuracy, certain branch types continue to mispredict. These are branches that may depend on longer history length, have loaded data values or exhibit random behavior (e.g., multi-target indirect branches and data-dependent direct and indirect branches). These are hard-to-predict branches since their outcome do not always exhibit repeatable patterns and trying to predict the outcome of such branches using typical branch predictors result in bottlenecks and low-performance.

Classifying branches to identify such hard-to-predict branches (or other types of branches) and selecting a branch predictor based on the type of branch improves accuracy and performance. Existing methods for classifying branches into, for example, hard-to-predict and simple branches analyze the actual behavior and predicted behavior of a branch and compare the accuracy of branch prediction with a pre-defined threshold. However, such methods of comparing the accuracy of branch prediction to a pre-defined and fixed threshold do not take into account the workload of the processor, applications running on the processor, mis-prediction rate corresponding to such applications, and/or other micro-architectural aspects of the processor, and hence may introduce certain inefficiency.

A method for identifying hard-to-predict branches which adapts to the applications' branch behavior and dynamically tunes the threshold will further improve accuracy of branch classification and processor performance.

SUMMARY OF THE INVENTION

The summary of the disclosure is given to aid understanding of the computer processing systems and methods of classifying branch instructions, and not with an intent to limit the disclosure or the invention. The present disclosure is directed to a person of ordinary skill in the art. It should be understood that various aspects and features of the disclosure may advantageously be used separately in some instances, or in combination with other aspects and features of the disclosure in other instances. Accordingly, variations and modifications may be made to the memory systems, architectural structure and method of operation to achieve different effects.

The present invention generally provides improved methods and systems for classifying branch instructions in a processor. In one embodiment, the system is a computing system that includes a memory and a processor. The processor also includes a processor pipeline comprising one or more execution units configured to execute branch instructions, a branch predictor associated with the processor pipeline and configured to predict a branch instruction outcome, and a branch classification unit associated with the processor pipeline and the branch prediction unit. The branch classification unit is configured to, in response to detecting a branch instruction, classify the branch instruction either a simple branch or a hard-to-predict (HTP) branch. The system dynamically adjusts threshold used for the classification based on a workload of the processor.

In an embodiment, the branch classification unit may comprise a branch classification table (BCT) including one or more entries. Each of the one or more entries may include one or more fields configured to record an actual behavior and a predicted behavior of a branch. The branch classification unit may further comprise a threshold determination module configured to adjust a value of at least one of the one or more fields of the BCT based on the workload of the processor. Optionally, the one or more entries of the BCT are organized as a 2-way set-associative table.

Additionally and/or alternatively, may further include each of the one or more entries of the BCT further include one or more of the following fields: a tag field, a correct prediction counter field, a misprediction field, a branch type field, and a usefulness bits field. Optionally, the threshold determination module may be configured to adjust a value of the correct prediction counter field of the BCT.

In one or more embodiments, the branch classification unit may be configured to, in response to detecting a branch instruction, classify the branch instruction by extracting an index from an instruction address of the detected branch instruction, extracting a tag from the instruction address of the detected branch instruction, and using the tag to determine whether at least one of the one or more entries of the BCT corresponds to the detected branch instruction. If at least one of the one or more entries of the BCT corresponds to the detected branch instruction, the branch classification unit may determine a branch type of the detected branch based on a branch type field of the at least one entry. Optionally, if at least one of the one or more entries of the BCT corresponds to the detected branch instruction, the branch predictor may predict an outcome of the detected branch instruction, and the processor pipeline may execute the detected branch instruction. The system may then update the BCT based on an actual behavior and a predicted behavior of the branch instruction using one or more of the following rules: decrement a value in a correct prediction counter field of the BCT by 1 if a predicted branch direction matches an actual branch direction, or decrement a value in a misprediction field of the BCT by 1 if a predicted branch direction does not match an actual branch direction.

Optionally, the branch classification unit may further be configured to determine whether a value in at least one of the correct prediction counter field or the misprediction counter field is zero, and if that the value in at least one of the correct prediction counter field or the misprediction field is zero classify the branch instruction based on the following rules: classify the branch instruction as HTP if the value of the misprediction field is zero, or classify the branch instruction as simple if the value of the correct prediction counter field is zero and the value of the misprediction field is greater than zero. The branch classification unit may update a branch type field of the BCT based on the classification. The branch classification unit may also update a usefulness bits field of the BCT based on the classification.

Optionally, if at least one of the one or more entries of the BCT does not correspond to the detected branch instruction, the system may create a new entry in the BCT corresponding to the branch instruction, and assign the branch instruction a branch type of simple branch. In an embodiment, the system may only create the new entry if the branch instruction is mispredicted and/or at least one of the one or more entries of the BCT have a usefulness bits field value of 0.

In at least one embodiment, the threshold determination module may be configured to adjust a reset value of the correct prediction counter field of the BCT by determining whether a predetermined number of instructions have been received by the processor pipeline, comparing a threshold value to a ratio of a stream count to a misprediction count if the predetermined number of instructions have been received by the processor pipeline, and updating the value of a reset correct prediction counter field of the threshold determination module based on the comparison, and using the value of the reset correct prediction counter field of the threshold determination module to adjust the value of the correct prediction counter field of the BCT. The stream count is a number of branch instructions classified as HTP by the BCT, and the misprediction count is a number of times an actual behavior of a branch instruction does not match the predicted behavior of the branch instruction. Optionally, updating the value of a reset correct prediction counter field of the threshold determination module based on the comparison may include incrementing the reset correct prediction counter field by 1 if the ratio is less than the threshold value and/or decrementing the reset correct prediction counter field by 1 if the ratio is greater than or equal to the threshold value. In an embodiment, the threshold value may be dynamically calculated based on one or more factors corresponding to the workload of the processor selected from the following: types and number of applications running on the processor, number of mispredictions, number of instructions received per cycle (IPC), number of instructions executed per cycle, the dispatch to complete ratio for the instructions, execution unit utilization factor, domain served, applications, real estate availability, power budget, and/or desired processing times.

BRIEF DESCRIPTION OF THE DRAWINGS

The various aspects, features and embodiments of processor, architectural structure, and its method of operation will be better understood when read in conjunction with the figures provided. Embodiments are provided in the figures for the purpose of illustrating aspects, features and/or various embodiments of the processor, architectural structure and method of operation, but the claims should not be limited to the precise arrangement, structures, features, aspects, embodiments or devices shown, and the arrangements, structures, subassemblies, features, aspects, embodiments, methods, and devices shown may be used singularly or in combination with other arrangements, structures, subassemblies, features, aspects, embodiments, methods and devices.

DETAILED DESCRIPTION

The following description is made for illustrating the general principles of the invention and is not meant to limit the inventive concepts claimed herein. In the following detailed description, numerous details are set forth in order to provide an understanding of a processor, its architectural structure, and its method of operation, however, it will be understood by those skilled in the art that different and numerous embodiments of the processor, architectural structure, and method of operation may be practiced without those specific details, and the claims and invention should not be limited to the embodiments, subassemblies, features, processes, methods, aspects, features of details specifically described and shown herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc. It must also be noted that, as used in the specification and the appended claims, the singular forms "a," "an" and "the" include plural referents unless otherwise specified.

The term "workload" of a processor refers to the number of instructions being executed by the processor during a given period or at a particular instant of time.

Figure 1:
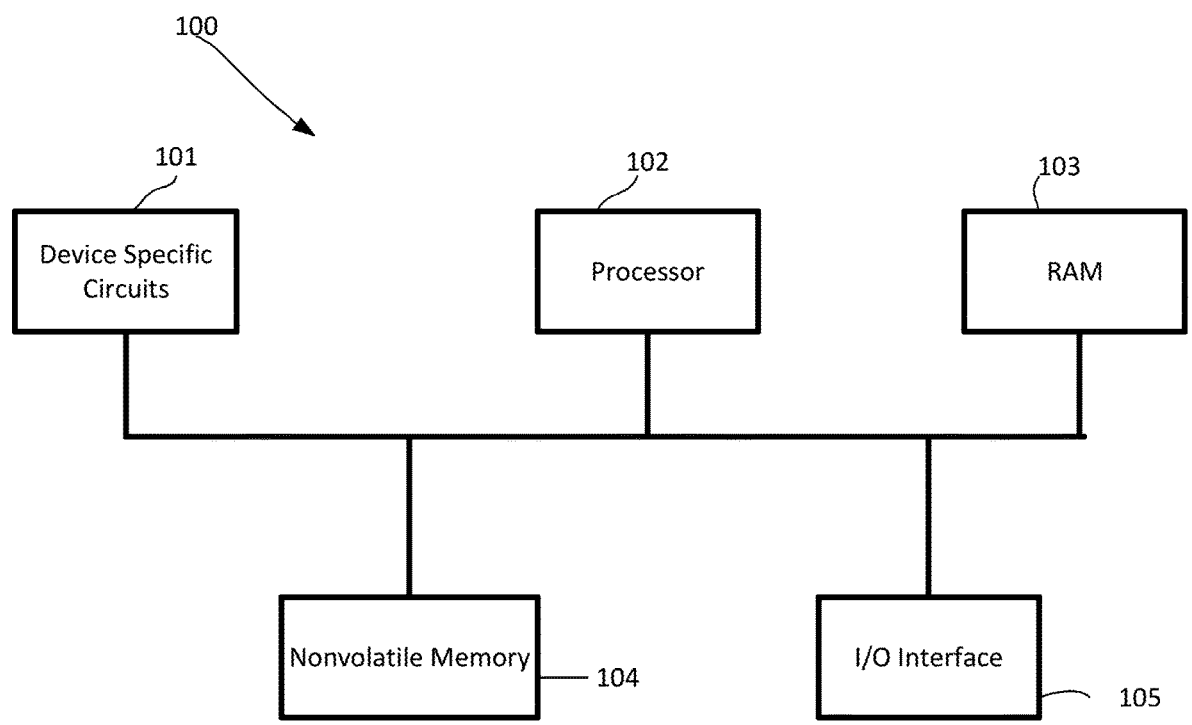
FIG. 1 depicts a general computing or data processing system in accordance with an embodiment.

A computing or data processing system 100 suitable for storing and/or executing program code may take many forms and in one embodiment may include at least one processor 102, which may be or be part of a controller, coupled directly or indirectly to memory devices or elements through a system bus, as shown in FIG. 1. Computing system 100 in FIG. 1 is shown with a processor 102, Random Access Memory (RAM) 103, nonvolatile memory 104, device specific circuits 101, and I/O interface 105. Alternatively, the RAM 103 and/or nonvolatile memory 104 may be contained in the processor 102 as could the device specific circuits 101 and I/O interface 105. The processor 102 may comprise, for example, an off-the-shelf microprocessor, custom processor, Field Programmable Gate Array (FPGA), Application Specific Integrated Circuit (ASIC), discrete logic, etc., or generally any device for executing instructions. The RAM 103 is typically used to hold variable data, stack data, executable instructions, etc., and may include Dynamic Random Access Memory or DRAM.

According to various approaches, the nonvolatile memory 104 may comprise any type of nonvolatile memory such as, but not limited to, Electrically Erasable Programmable Read Only Memory (EEPROM), flash Programmable Read Only Memory (PROM), battery backup RAM, hard disk drives, etc. The nonvolatile memory 104 is typically used to hold the executable firmware and any nonvolatile data containing programming instructions that can be executed to cause the processor 102 to perform certain functions.

In some embodiments, the I/O interface 105 may include a communication interface that allows the processor 102 to communicate with devices external to the controller. Examples of the communication interface may comprise, but are not limited to, serial interfaces such as RS-232, USB (Universal Serial Bus), Small Computer Systems Interface (SCSI), RS-422 or a wireless communication interface such as Wi-Fi, Bluetooth, near-field communication (NFC) or other wireless interfaces. The computing system 100 may communicate with an external device via the communication interface 105 in any communication protocol such as Automation/Drive Interface (ADI).

Figure 2:
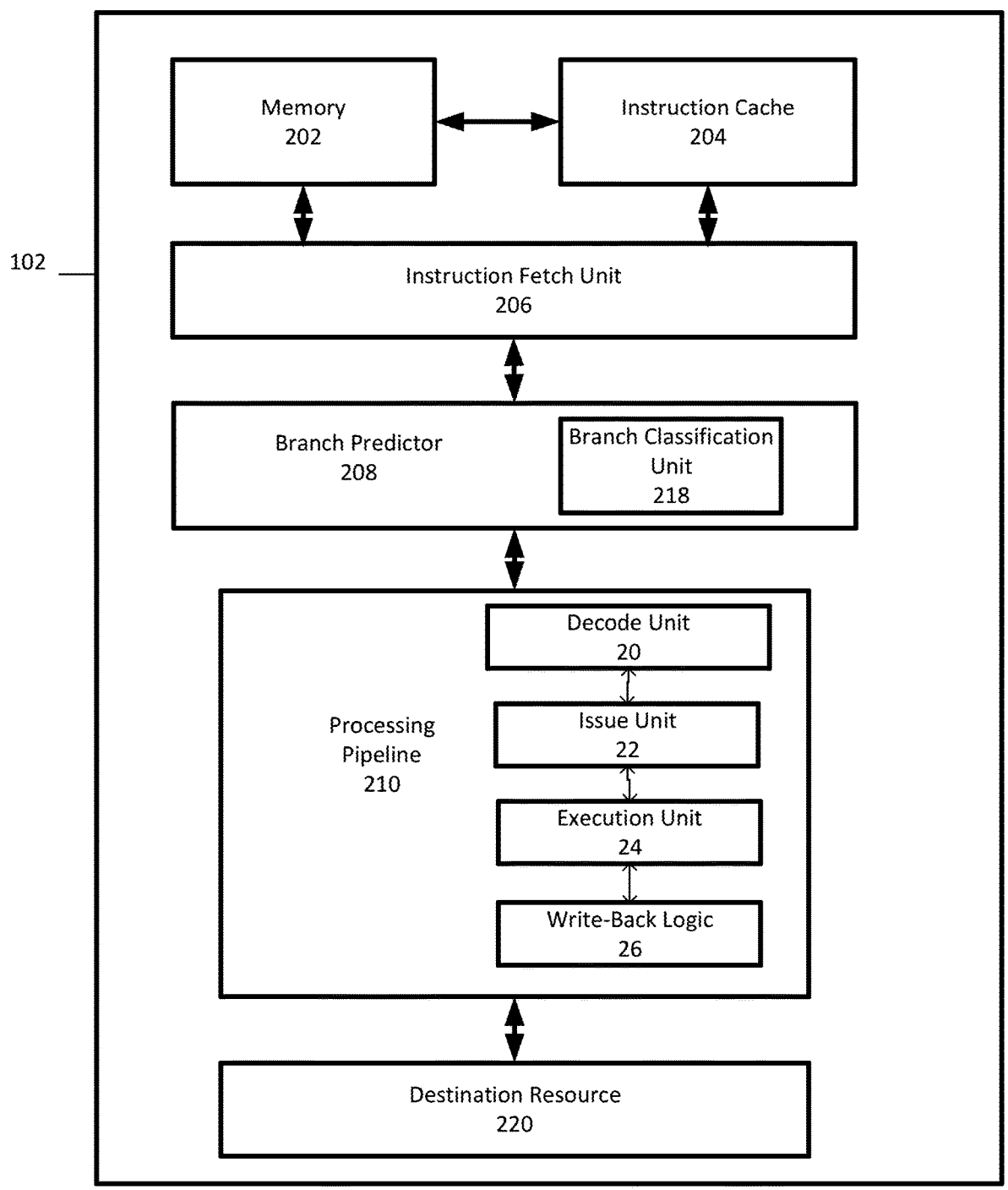
FIG. 2 depicts a block diagram of a processor in accordance with an embodiment.

FIG. 2 depicts a block diagram of a processor 102 according to an embodiment. The processor 102 includes memory 202, instruction cache 204, instruction fetch unit 206, branch predictor 208, branch classification unit 218, and processing pipeline 210. The processor 102 may be included within a computer processor or otherwise distributed within a computer system. Instructions and data can be stored in memory 202, and the instruction cache 204 may access instructions in memory 202 and store the instructions to be fetched. The memory 202 may include any type of volatile or nonvolatile memory, such as cache memory. The memory 202 and instruction cache 204 can include multiple cache levels. A data cache (not depicted) may also be included in the processor 102. In one embodiment, instruction cache 204 may be configured to provide instructions in an 8-way set associative structure. Alternatively, any other desired configuration and size may be employed. For example, instruction cache 204 may be implemented as a fully associative, set associative, or direct mapped configuration.

In FIG. 2, a simplified example of the instruction fetch unit 206 and the processing pipeline 210 are depicted. In various embodiments, the processor 102 may include multiple processing pipelines 210 and instruction fetch units 206. In an embodiment, the processing pipeline 210 includes a decode unit 20, an issue unit 22, an execution unit 24, and write-back logic 26. The instruction fetch unit 206 and/or the branch predictor 208 may also be part of the processing pipeline 210. The processing pipeline 210 may also include other features, such as error checking and handling logic, reorder buffer, one or more parallel paths through the processing pipeline 210, and other features now or hereafter known in the art. While a forward path through the processor 102 is depicted in FIG. 2, other feedback and signaling paths may be included between elements of the processor 102.

The instruction fetch unit 206 fetches instructions from the instruction cache 204 according to an instruction address, for further processing by the decode unit 20. The decode unit 20 decodes instructions and passes the decoded instructions, portions of instructions, or other decoded data to the issue unit 22. The decode unit 20 may also detect branch instructions which were not predicted by branch predictor 208. The issue unit 22 analyzes the instructions or other data and transmits the decoded instructions, portions of instructions, or other data to one or more execution units in the execution unit 24 based on the analysis. The execution unit 24 executes the instructions and determines if the predicted branch direction is incorrect. The branch direction may be "taken", in which subsequent instructions are fetched from the target address of the branch instruction. Conversely, the branch direction may be "not taken", in which subsequent instructions are fetched from memory locations consecutive to the branch instruction. When a mispredicted branch instruction is detected, instructions subsequent to the mispredicted branch are discarded from the various units of processor 102. The execution unit 24 may include a plurality of execution units, such as fixed-point execution units, floating-point execution units, load/store execution units, and vector multimedia execution units. The execution unit 24 may also include a count cache to predict branch to count register (bcctr) instructions. The write-back logic 26 writes results of instruction execution back to a destination resource 220. The destination resource 220 may be any type of resource, including registers, cache memory, other memory, I/O circuitry to communicate with other devices, other processing circuits, or any other type of destination for executed instructions or data. One or more of the processor pipeline units may also provide information regarding the execution of conditional branch instructions to the branch predictor 208.

In an embodiment, processor 102 may perform branch prediction in order to speculatively fetch instructions subsequent to conditional branch instructions. Branch predictor 208 is included to perform such branch prediction operations. In an embodiment, instruction cache 204 may provide to the branch predictor 208 an indication of the instruction address being fetched, so that branch predictor 208 may determine which branch target addresses to select for forming a branch prediction. The branch predictor 208 may be coupled to various parts of the processing pipeline 210, such as, for example, execution unit 24, decode unit 20, reorder buffer, etc. to determine if the predicted branch direction is correct or incorrect.

In an embodiment, a variety of suitable branch prediction algorithms may be employed by the branch predictor 208. The branch predictor 208 may include any combination of primary branch prediction structures or circuits, such as a branch target buffer (BTB), a branch history table (BHT), one or more pattern history tables (PHT), or the like. The BTB may be set associative and include multiple sets (columns) of BTB entries and each BTB entry may include, for example, a branch address tag and a predicted target address. The BTB may also be direct mapped or fully-associative. The BTB may be a global buffer that records the outcome of every branch that executes, or it may be a per-branch buffer that records only the past history of the same branch. The BHT may hold branch history information that indicates whether a branch is predicted as taken or not taken. The BHT can also include prediction strength indicators for BHT direction predictions (e.g., strong not taken, weak not taken, weak taken, and strong taken). The BHT may be indexed based on an instruction address. A PHT may hold prediction strength indicators for direction predictions and tags associated with branch prediction patterns. To predict a branch in existing branch prediction hardware, the branch instruction's address is combined with the current value of the branch history. This can be a global branch history of the last k branch outcomes (such as a PHT) or a table that has a per-branch history, i.e. the last k outcomes of the same branch (such as a BHT). The resulting value is used to index into a predictor table in order to read off the prediction. After the branch actually executes, the outcome of the branch is shifted into the BTB.

In an embodiment, the branch predictor 208 also includes a branch classification unit 218 (BCU). Alternatively and/or additionally, the BCU 218 may be located separately from the branch predictor 208. In an embodiment, the branch predictor 208 and/or the BCU 218 may be included in the instruction fetch unit and/or the processor pipeline. The BCU 218 is an example of a processing circuit configured to implement branch classification with confidence and usefulness tracking.

Figure 3:
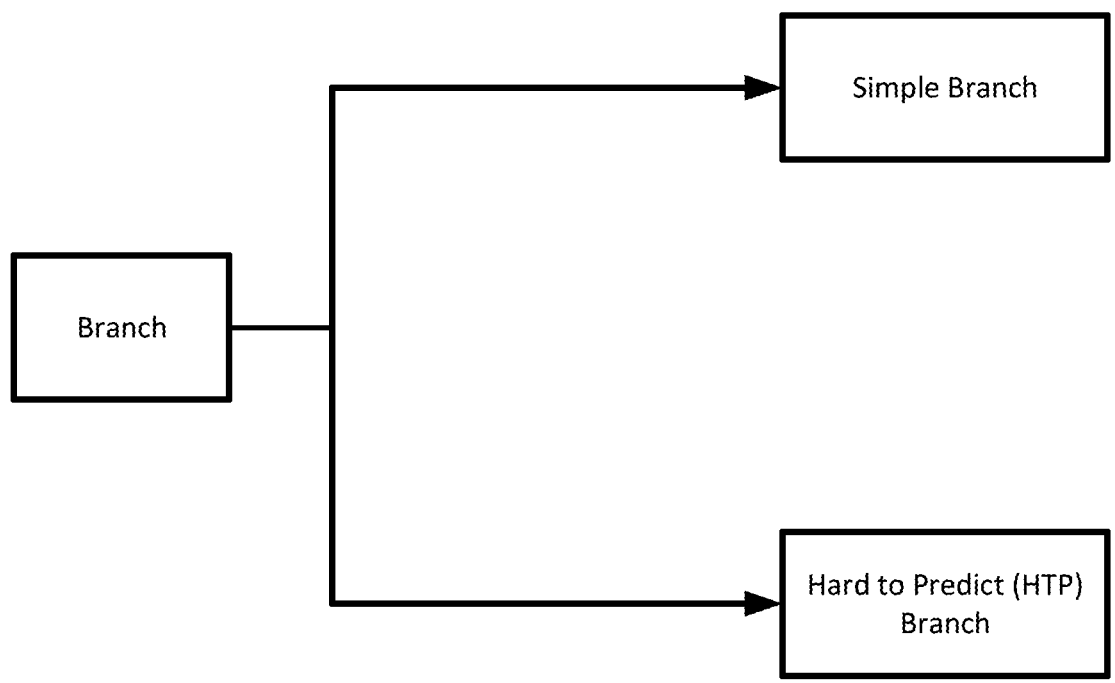
FIG. 3 illustrates branch classes or types used by a branch classification unit in accordance with an embodiment.

In an embodiment, the BCU 218 may apply a set of heuristics to implement branch classification by assigning all incoming branch instructions to one of the branch types illustrated in FIG. 3. Branch classification may partition branches into a set of branch classes statically and/or dynamically by assigning similar behavior to the same class of branches. Furthermore, BCU 218 may dynamically analyze the various processor attributes (such as, for example, the workload, number of instructions per cycles, number of instructions executed per cycle, dispatch to complete ratio, execution unit utilization factors, resources available in the processor, number of instruction streams generated, or the like) in real-time to dynamically determine an accuracy threshold and a stream threshold. The BCU 218 may then perform branch classification by comparing a misprediction accuracy with the dynamically determined threshold accuracy. As such, by analyzing the behavior of a class of branches in conjunction with the real-time processor attributes, branch prediction accuracy for that class may be optimized for a given hardware. For example, prediction accuracy and the number of streams generated may be increased or decreased based on the workload of a processor and/or other processor attributes to maintain desired efficiency of branch execution and performance levels. Specifically, a lowest accuracy rate corresponding to branch classification for a given processor workload may be determined dynamically.

It should be understood that the heuristics described in this disclosure are the result of profiling branches in an industry standard CPU benchmark. Different classes of branches have common characteristics (such as number of branch miss-predictions) that produce the above-listed heuristics. It is appreciated that other embodiments may apply a different set of heuristics. In still other implementations, a subset of the above-listed heuristics may be utilized.

Branch classes or types illustrated in FIG. 3 are classified based on the dynamic branch execution and/or prediction behavior. As shown in FIG. 3, in an embodiment, based on their prediction accuracy, branches may be classified into simple branches and hard-to-predict (HTP) branches. Simple branches are branches whose outcome may be predicted with a high level of accuracy, and HTP branches are branches whose outcome may be predicted with a low level of accuracy. It should be understood that the branch classification unit may be used to classify branch instructions into types or classes that are different and/or a subset of those illustrated in FIG. 3.

Figure 4:
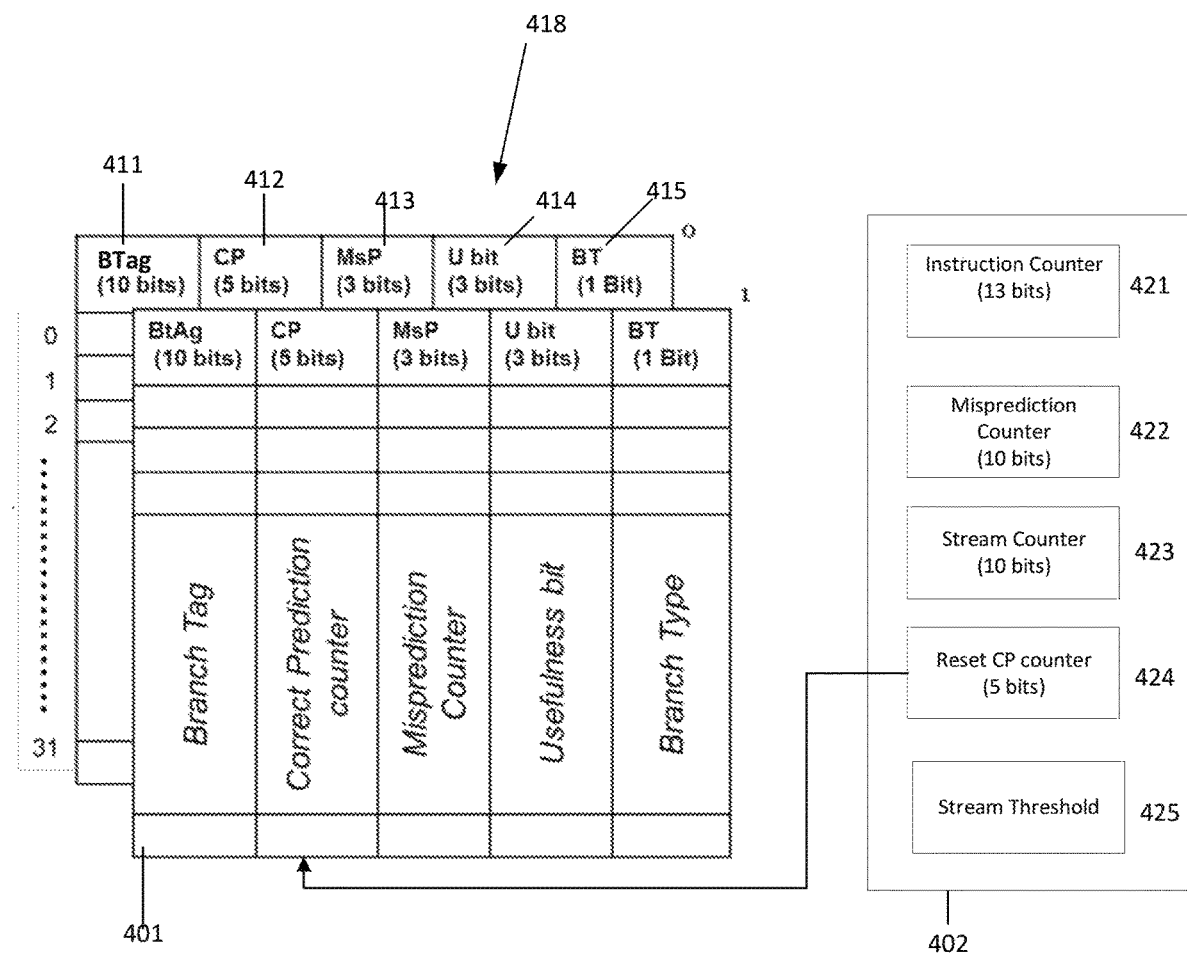
FIG. 4 depicts a branch classification unit in accordance with an embodiment.

FIG. 4 illustrates an example BCU 218 that is used to determine and track the branch type for branch instructions before being forwarded to the branch predictor 208, according to an embodiment. In an embodiment, the BCU 218 includes a branch classification table (BCT) 401 and a threshold determination module 402. As discussed below, the BCT 401 is a statistical table that stores information relating to the actual behavior of selective conditional branch instructions and their predicted behaviors, and may use the information to classify incoming branch instructions. The threshold determination module 402, on the other hand analyzes factors relating to the workload of the processor and/or applications running on the processor in real-time and modifies or influences certain parameters and/or functioning of the BCT 401 (i.e., the correct prediction counter value is modified as discussed below) based on the workload in order to control the accuracy of classification of the BCT. Specifically, since various workloads and/or different applications exhibit different levels of accuracy for identifying HTP branches, the threshold determination module 402 may control the functioning of the BCT 401 such that the lowest accuracy (pre-defined) branches are identified as HTP for all workloads. The threshold determination module dynamically determines the optimal threshold point for different workloads and/or applications of the processor to improve the accuracy of branch classification.

It should also be understood that the outcome of the branch classification may be utilized in various ways to improve performance, without deviating from the principles of this disclosure. For example, an advanced prediction mechanism may be applied to predict the outcome of only those branches which are classified as "hard to predict" by BCU 218.

Alternatively and/or additionally, both the taken path and the not taken path instruction sequences may be issued and executed for all the branches marked as hard to predict branches by the BCU 218. The wrong sequence or instruction stream may then be discarded after actual execution of the branch and determining the correct path. In such a case, if, for example, the overall prediction accuracy of the branch prediction for an application and/or workload is 70% (poor branch-prediction overall) and the threshold is fixed to be 80% (or 0.8) irrespective of the workload and/or applications of the processor, then a very high number of branches will be marked as HTP. As a result, a disproportionately high number of instruction streams would be generated (without branch prediction) for all the branches that are classified as HTP leading to reduction in the overall performance. However, the system of the current disclosure may dynamically adjust the threshold value based on the number of instruction streams generated (discussed below), and thus control the number of branches marked as HTP and improve the performance Similar other uses are within the scope of this disclosure.

As discussed above, to reduce misprediction penalty and/or when a hard to predict branch is encountered, a processor may fetch both instruction streams (taken and not taken) if an HTP branch is encountered. As such, the number of streams generated also needs to be dynamically adjusted based on the processor workload and/or applications in order to improve the processor efficiency. Hence, the threshold determination module 402 also determines the number of streams to be generated based on the processor workload.

Hence, the BCU 218 is configured to identify hard-to-predict branches by taking into account the workload of a processor in real-time to dynamically adjust the accuracy and the stream threshold in order to improve accuracy of branch classification and processor performance.

In an embodiment, BCT 401 may be a 2-way set-associative table of branch classification information, generally organized as a table. In an embodiment, the BCT 401 may include 256 entries, 128 entries, 64 entries, or the like. For example, the BCT 401 shown in FIG. 4 includes 64 entries (0-31 rows in, for example, a 2-way set-associative table). Alternatively, any other desired configuration may be employed such as, for example and without limitation, direct mapped, set-associative, or n-way set associative cache. In an embodiment, the BCT table 401 is written with information about branches executed in pipelines of processor 102 (depicted in FIG. 2) where each entry in BCT 401 represents a branch instruction. In an embodiment, each entry in the BCT 401 has 22 bits (0-21) as discussed below.

The table of BCT 401 may be indexed with instruction virtual address bits that determine the BCT set/row. For example, 5 bits of the instruction address may be extracted after right shifting 6 bits. Additional branch instruction address bits may also be stored within the BCT entry as Btag bits (411). In an embodiment, the Btag 411 may be a tag extracted from the instruction address corresponding to the branch instruction. The Btag may be extracted from the instruction address using methods now or hereafter known to those skilled in the art such as, for example and without limitation, using one or more significant bits, using a xor operation, or the like. In an example embodiment, the Btag may be a 10-bit tag extracted from the instruction address after right shifting 6 bits. Each set/row of the BCT 401 may further include multiple ways/columns. It should be understood that the number of index bits and tag bits will depend on the type of BCT table (fully associative, set-associative, or direct mapped). It will be understood to those skilled in the art that branch classification methods may work without the tag field in the BCT, but it may lead to reduced classification accuracy. The advantage of Btag field is to improve the accuracy and precision of the classification.

As shown in FIG. 4, BCT 401 also includes a correct prediction counter (CP counter) field 412, a misprediction (MsP) field 413, a usefulness bits (U Bit) field 414, and a branch type (BT) field 415. In an embodiment, the CP counter field 412 is a 5-bit field that can have a value of 0-31. The value in the CP counter field is periodically assigned based on the workload of the processor (discussed below). Furthermore, the accuracy of classification performed by BCT (i.e., the accuracy of identifying HTP branches) is dependent upon the value of the CP counter field. Initially, when a new entry for a branch is created in the BCT 401, the CP counter field is assigned a value determined by the threshold determination module, as described in FIG. 6.

In an embodiment, the MsP field 413 is a 3-bit field that can have a value of 0-7. Initially, when a new entry for a branch is created in the BCT 401, the MsP field is assigned a maximum value of 7. The U bits field 414 is a 3-bit field that is indicative of how often a branch instruction is executed, i.e., the usefulness of a branch. Usefulness tracking enables efficient use of space in a BCT table by identifying dormant branch instruction entries that are used infrequently and which may be replaced (i.e., have minimal operational usefulness). Finally, the BT field 415 is a 1-bit field that is assigned a value 1 for an HTP branch and a value 0 for a simple branch. In an embodiment, each new entry corresponding to a new branch instruction (that does not already have an entry in the BCT) is initially assigned a 0 value in the BT field, which may then be updated based on the methods discussed below. In other words, each new branch is assumed to be a simple branch.

As shown in FIG. 4, BCU 418 also includes a threshold determination module 402 that includes a 13-bit instruction counter field 421, a 10-bit misprediction counter field 422, a 10-bit stream counter field 423, a 5-bit reset CP counter field 424, and a stream threshold field 425. The stream threshold field 425 may be a floating point register whose size may be chosen based on the granularity required for the process of determining the threshold. In an example embodiment, the stream threshold register 425 may be a 32 bit register. The various counters included in the threshold determination module 402 are typically implemented as a binary saturating counter. For example, if a 10-bit saturating counter is used, the possible values of the counter are [0, 1, 2, . . . 1024]. The output of the counter can be used to decide the course of action. In an embodiment, the instruction count field 421 records the number of instructions received by the instruction fetch unit of the processor and is reset after $2^{13}$ instructions are received, the misprediction counter field 422 records the number of mispredictions by the branch predictor of the processor (i.e., when the actual behavior of a branch instruction does not match its predicted behavior), and the stream counter field 423 records the number of branch instructions that are identified as HTP by the BCT. In an embodiment, the reset CP counter field 424 records the current CP counter value and provides it to the BCT 401, and the threshold field 425 records the current threshold which is determined based on the workload of the processor (as discussed below in FIG. 6).

It should be understood that the number of fields and the bit size of each field in the BCT 401 and/or the threshold determination module 402 is provided as an example, and other bit sizes are within the scope of this disclosure in order to change, for example, precision and/or accuracy of classification, number of types of branches, branch characteristics, processing times, or the like.

Figure 5:
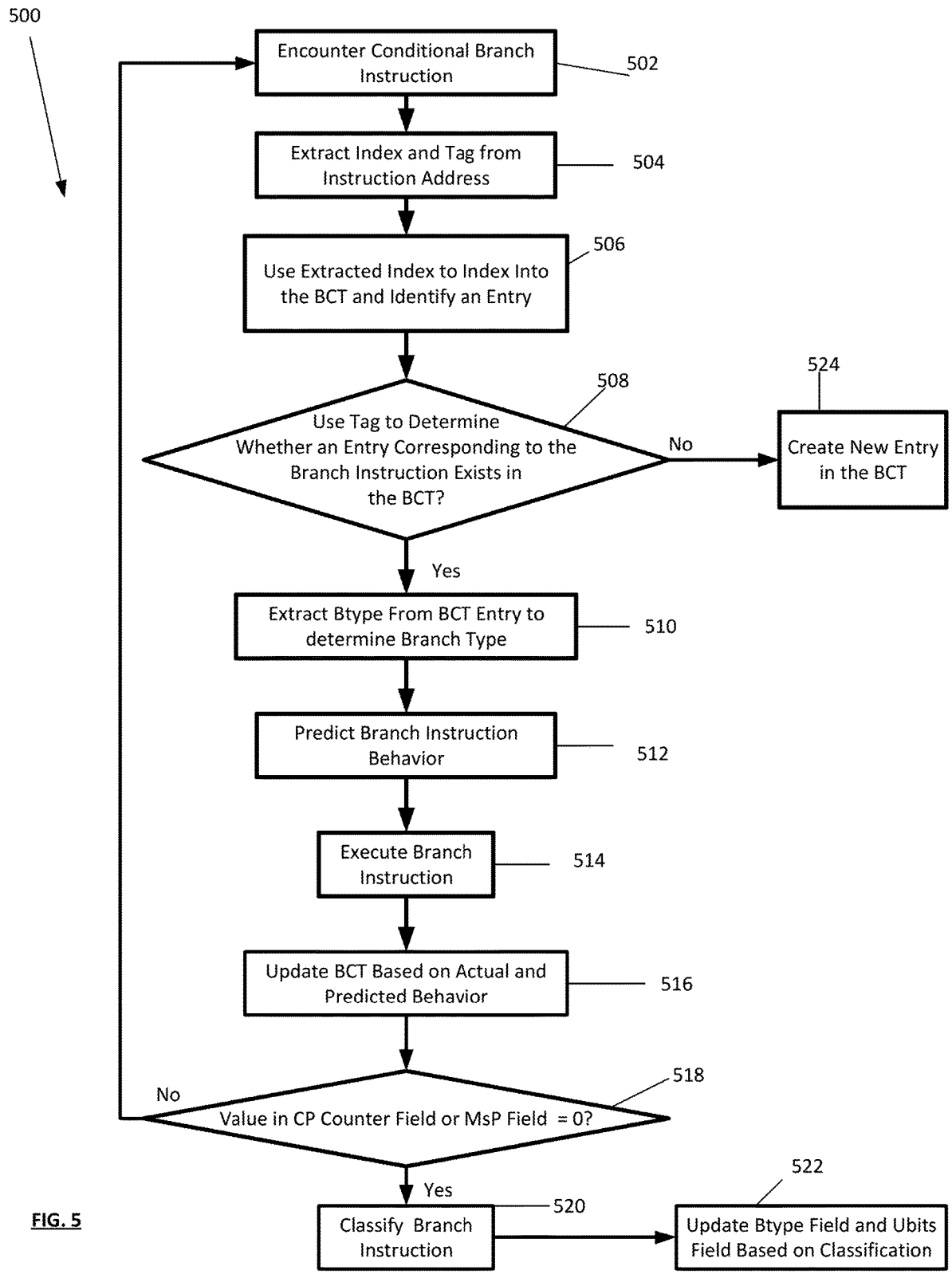
FIG. 5 illustrates an example flowchart describing a method for workload based classification of instruction branches using the branch classification unit of FIG. 3 in accordance with an embodiment.

FIG. 5 illustrates an exemplary flowchart in accordance with one embodiment describing a method for classifying instruction branches using the BCU described above that dynamically adjusts the threshold for branch classification based on the workload and/or applications of the processor. While the classification method 500 is described for the sake of convenience and not with an intent of limiting the disclosure as comprising a series and/or a number of steps, it is to be understood that the process does not need to be performed as a series of steps and/or the steps do not need to be performed in the order shown and described with respect to FIG. 5, but the process may be integrated and/or one or more steps may be performed together, or the steps may be performed in the order disclosed or in an alternate order.

While the illustrative embodiments described above are preferably implemented in hardware, such as in functional units of a processor, various aspects of the illustrative embodiments may be implemented in software as well. For example, it will be understood that each block of the flowchart illustration in FIG. 5, and combinations of blocks in the flowchart illustration, can be implemented by computer program instructions. These computer program instructions may be provided to a processor or other programmable data processing apparatus to produce a machine, such that the instructions which execute on the processor or other programmable data processing apparatus create means for implementing the functions specified in the flowchart block or blocks. These computer program instructions may also be stored in a computer-readable memory or storage medium that can direct a processor or other programmable data processing apparatus to function in a particular manner, such that the instructions stored in the computer-readable memory or storage medium produce an article of manufacture including instruction means which implement the functions specified in the flowchart block or blocks.

Accordingly, blocks of the flowchart illustration support combinations of means for performing the specified functions, combinations of steps for performing the specified functions and program instruction means for performing the specified functions. It will also be understood that each block of the flowchart illustration, and combinations of blocks in the flowchart illustration, can be implemented by special purpose hardware-based computer systems which perform the specified functions or steps, or by combinations of special purpose hardware and computer instructions.

At 502, the instruction fetch unit may encounter a conditional branch instruction for execution and may transfer it to the branch predictor for classification and prediction. At 504 the system may then extract a 5 bit index and a 10 bit tag from the instruction address of the branch instruction (for example, by right shifting 6 bits). The system may use the extracted index to index into the BCT (506). The system may use the extracted tag to determine (508) whether or not an entry corresponding to the branch instruction already exists in the BCT at the indexed location. In other words, the system may determine whether one of the Btags associated with the two entries in the 2-way BCT at the indexed location matches the extracted tag.

If at 508, it is determined an entry corresponding to the branch instruction exists in the BCT (508: YES), then the branch type is determined based on the value of the BT field (510) of that entry (simple if the value is 0 and HTP if the value is 1). Once the branch type is determined, the method may continue to verify classification (i.e., whether or not the branch type determined based on the BT field matches branch type based on classification performed below in step 518) and/or update the BTT as described below in steps 512-522.

At 512, the system may perform branch prediction to determine a predicted behavior of the branch instruction. At 514, the branch instruction may be executed to determine the actual behavior of the branch instruction. It should be noted that one of the advantages of the present disclosure is that branch classification may be used during branch prediction to optimize the prediction process. This feature can be particularly valuable in dynamically optimizing branch prediction and execution of the branch instruction.

Upon execution of the branch instruction, at 516 the BCT may be updated based on the predicted and actual behavior of the branch instruction. For updating the BCT, if the predicted behavior of the branch matches the actual behavior (i.e., if the prediction for the branch instruction was taken and the branch was actually taken, or if the prediction for the branch instruction was not-taken and the branch was actually not-taken), the CP counter field is decremented by 1. In an embodiment, the initial value of the CP counter field is determined by the system using the method described below in FIG. 6.

If the predicted behavior of the branch does not match the actual behavior (i.e., misprediction) because prediction for the branch instruction was taken and the branch was actually not-taken, or if the prediction for the branch instruction was not-taken and the branch was actually taken), the MsP field is decremented by 1.

At 518, the system may determine whether the value in the CP counter field and/or the MsP field has reached a minimum value of 0. If neither the value in the CP counter field nor the MsP field has reached a minimum value of 0, the system returns a branch type determined in step 510, However, if either the value in the CP counter field and/or the MsP field has reached a minimum value of 0, the system performs branch classification in step 520 and returns the branch type accordingly, and updates the BT field value. In other words, if at 518 it is determined that a field in the confusion matrix has hit the minimum value (518: YES), then the system classifies the branch instruction (520) as follows:

TABLE 1

| Branch Type | Rules |
| --- | --- |
| Hard to Predict | MsP == 0 |
| Simple | CP counter == 0 and MsP > 0 |

At 522, the system may update the BT field (0 if simple and 1 if HTP) and the UBit value field of the entry in the BCT based on the branch classification from step 520. In an embodiment, if the branch type is determined to be simple, the Ubit value is changed to zero, and if the branch type is determined to be HTP, the Ubit value is changed to the maximum value possible (i.e., 7 for a 3-bit field). Updating the Ubit field in this manner allows for replacement of entries corresponding to simple branches in the BCT (discussed below)

If at 508 it is determined that an entry corresponding to the branch instruction does not exist in the BCT (508: NO), then the system may create at step 524 a new entry corresponding to the branch instruction using the extracted tag. In an embodiment, the system may create a new entry corresponding to the branch instruction only if the branch instruction is mispredicted in step 516 (i.e., the actual behavior does not match the predicted behavior). Alternatively and/or additionally, a new entry may be created if the Ubit value of at least one of the entries corresponding to the index location is zero by replacing the entry whose Ubit value is zero with the new entry. However, if the Ubit value of entries in both sets corresponding to the index location are not zero, the Ubit values may be decreased by 1 and no new entry may be created. For the new entry, the Ubit value is assigned an initial value of 7, the MsP field is assigned an initial value of 7, and the BT value is assigned as 0. The value of the CP counter field is determined by the system using the method described below in FIG. 6.

Figure 6:
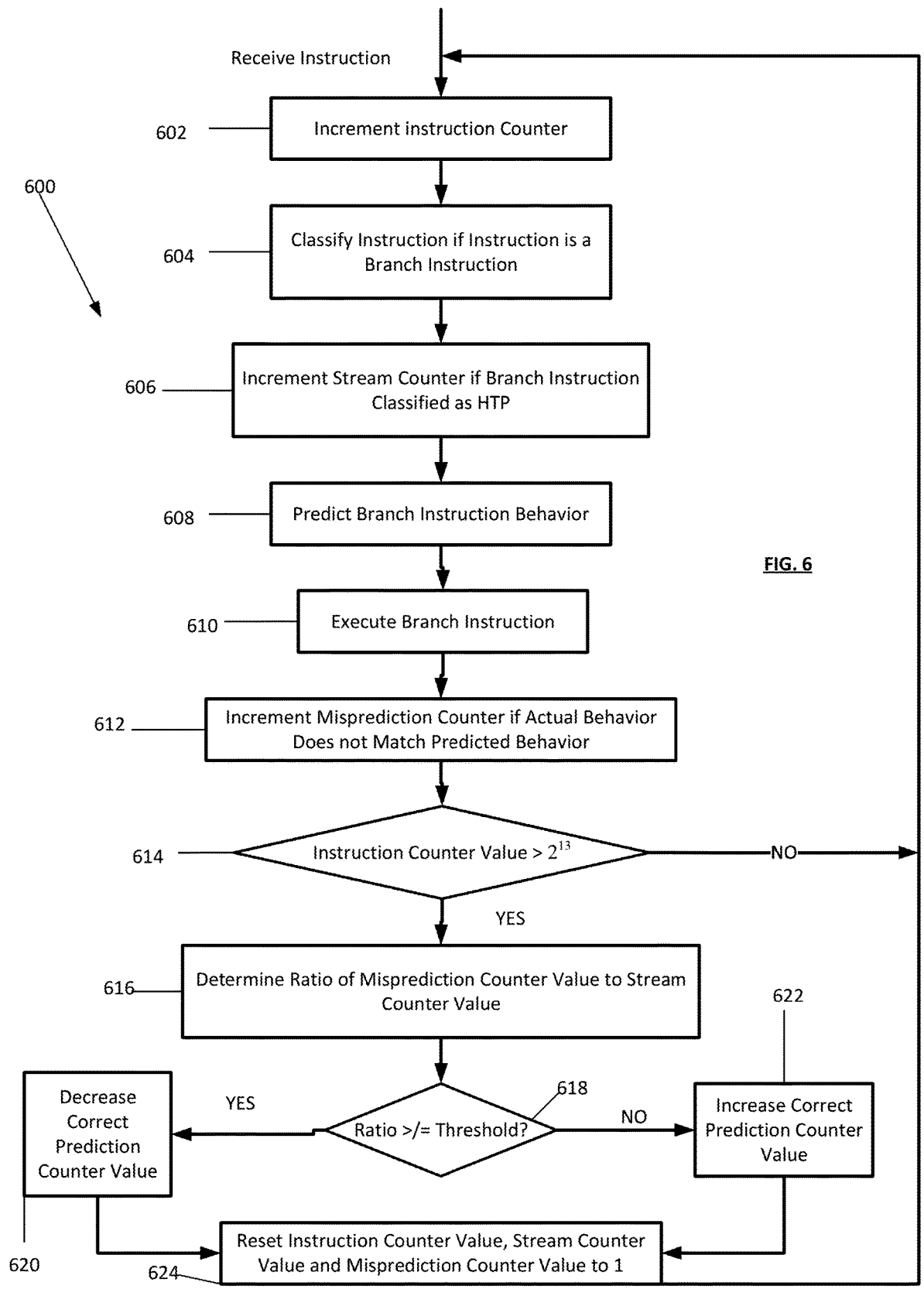
FIG. 6 illustrates an example flowchart describing a method for dynamically determining a threshold value, according to an embodiment.

FIG. 6 illustrates an exemplary flowchart in accordance with one embodiment describing a method for dynamically determining a threshold value (based on processor workload, applications of the processor, overall branch behavior, and/or other factors) that is used to update the CP counter field value of the BCT. While the classification method 600 is described for the sake of convenience and not with an intent of limiting the disclosure as comprising a series and/or a number of steps, it is to be understood that the process does not need to be performed as a series of steps and/or the steps do not need to be performed in the order shown and described with respect to FIG. 6, but the process may be integrated and/or one or more steps may be performed together, or the steps may be performed in the order disclosed or in an alternate order.

While the illustrative embodiments described above are preferably implemented in hardware, such as in functional units of a processor, various aspects of the illustrative embodiments may be implemented in software as well. For example, it will be understood that each block of the flowchart illustration in FIG. 6, and combinations of blocks in the flowchart illustration, can be implemented by computer program instructions. These computer program instructions may be provided to a processor or other programmable data processing apparatus to produce a machine, such that the instructions which execute on the processor or other programmable data processing apparatus create means for implementing the functions specified in the flowchart block or blocks. These computer program instructions may also be stored in a computer-readable memory or storage medium that can direct a processor or other programmable data processing apparatus to function in a particular manner, such that the instructions stored in the computer-readable memory or storage medium produce an article of manufacture including instruction means which implement the functions specified in the flowchart block or blocks.

Accordingly, blocks of the flowchart illustration support combinations of means for performing the specified functions, combinations of steps for performing the specified functions and program instruction means for performing the specified functions. It will also be understood that each block of the flowchart illustration, and combinations of blocks in the flowchart illustration, can be implemented by special purpose hardware-based computer systems which perform the specified functions or steps, or by combinations of special purpose hardware and computer instructions.

In an embodiment, every time the instruction fetch unit receives an instruction, the system may increment (602) the instruction counter value by 1. At 604, if the received instruction is a branch instruction, the system may classify the branch instruction using the steps discussed above with respect to FIG. 5. At 606, the system may increment the stream counter by 1 if the branch instruction is classified as an HTP. At 608, the system may transfer branch instruction to the branch predictor and branch prediction may be performed to determine a predicted behavior of the branch instruction. At 610, the branch instruction may be executed to determine the actual behavior of the branch instruction. At 612, the system may increment the misprediction counter by 1 if the actual behavior of the branch instruction does not match its predicted behavior At 614, the system may determine whether the value of the instruction counter is greater than a predetermined value (for example and without limitation $2^{13}$). If the value of the instruction counter is less than the predetermined value, e.g., $2^{13}$, the system may continue performing steps 602-612. However, if the value of the instruction counter is greater than the predetermined value, e.g., $2^{13}$, the system may determine a ratio (616) of the stream counter value to the misprediction counter value. At 618, the system may then compare the ratio of the stream counter value to the misprediction counter value to a threshold value to determine whether the ratio is greater than or equal to the threshold value.

In an embodiment, the threshold value may be determined or defined such that it controls the maximum number of branches marked as HTP by the BCT during classification in order to achieve the lowest HTP identification accuracy allowed for a given workload. The system may determine the threshold value based on the number of mispredictions allowed per 1000 instructions (MPKI). Alternatively and/or additionally, the system may determine the threshold value based on factors corresponding to the workload of the processor such as, without limitation, number of instructions received per cycle (IPC), number of instructions executed per cycle, the dispatch to complete ratio for the instructions, execution unit utilization factor, domain served, applications, real estate availability, power budget, desired processing times, or the like. For example:

$$\text{Threshold value} = X1*\text{MPKI} + X2*\text{IPC} + X3*\text{number of instructions executed per cycle} + X4*\text{dispatch to complete ratio} + X5*\text{number of instruction streams generated} \ldots Xn*\text{Factor } n \quad (1)$$

where, X1, X2, X3 . . . Xn are variables, values for which may be defined by a user to achieve a desired performance level for the processor. For example, values of X1, X2, X3 . . . Xn may be defined based on the amount of processing resources available, the workload of the processor, the efficiency requirements, or the like.

For example, in an embodiment, a user may define a variable finite value for X1, and X2, X3 . . . Xn=0 in order to set a threshold value that is solely dependent on the MPKI. This will ensure that the threshold value is only a function of the MPKI. As such, X1 may be decreased to decrease the threshold value and hence increase the processing time as well as the accuracy, or vice versa (as discussed below with respect to Table 2).

In an embodiment, the threshold value may also be used by the system to dynamically control the number of streams allowed by the processor per 1000 instructions. For example, in an embodiment:

$$\text{Number of streams per 1000 instructions} = \text{Threshold value} * MPKI \qquad (2)$$

Referring back to FIG. 6, if it is determined that the ratio of the stream counter value to the misprediction counter value is greater than or equal to the threshold value (618: YES), the system may decrement the reset CP counter field value by 1 (620) (up to a minimum value of 7, i.e., the CP counter field value is not decremented if it is already 7). However, if it is determined that the ratio of the stream counter value to the misprediction counter value is less than the threshold value (618: NO), the system may increment the reset CP counter field value (622) (up to a maximum value of 31). At 624, the value in the reset CP counter field is provided to the BCT. The BCT may use the received reset CP counter value to update the CP counter value of the BCT for performing classification of incoming branches.

At 624, the system may reset the instruction counter, the misprediction counter, and the stream counter value to 0.

Table 2 below illustrates the relationship between the CP counter values and classification accuracy achieved by a BCT for a constant MsP value of 7:

TABLE 2

| MsP Value | CP counter Value | Accuracy Level (%) |
| --- | --- | --- |
| 7 | 31 | 81.57 |
| 7 | 30 | 81.08 |
| 7 | 29 | 80.55 |
| 7 | 28 | 80 |
| 7 | 27 | 79.47 |
| . | . | . |
| . | . | . |
| . | . | . |
| 7 | 10 | 58.82 |
| 7 | 9 | 56.33 |
| 7 | 8 | 53.33 |
| 7 | 7 | 50 |

As such, the threshold value may be used to control the CP counter value and hence the accuracy of the classification performed by the BCT. Since the threshold value is dependent upon various factors relating to the workload of the processor, the aggressiveness and/or accuracy of the BCT may be configured based on the workload of the processor.

In an embodiment, the system may perform the classification without any accuracy calculations in order to minimize the branch classification time.

In an exemplary embodiment, where the BCU of FIG. 3 is implemented in hardware, the methods described herein, such as process 500 of FIG. 5 or process 600 of FIG. 6 can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be clear that the various features of the foregoing systems and/or methodologies may be combined in any way, creating a plurality of combinations from the descriptions presented above.

It will be further appreciated that embodiments of the present invention may be provided in the form of a service deployed on behalf of a customer to offer service on demand.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A processor comprising:
a processor pipeline comprising one or more execution units configured to execute branch instructions;
a branch predictor associated with the processor pipeline and configured to predict a branch instruction outcome; and
a branch classification unit associated with the processor pipeline and the branch prediction unit, and configured to, in response to detecting a branch instruction, classify the branch instruction as at least one of the following: a simple branch or a hard-to-predict (HTP) branch, wherein a threshold used for the classification is dynamically adjusted based on a workload of the processor, wherein the branch classification unit comprises:
a branch classification table (BCT) including one or more entries, wherein each of the one or more entries includes one or more fields configured to record an actual behavior and a predicted behavior of a branch instruction; and
a threshold determination module configured to adjust a value of at least one of the one or more fields of the BCT based on the workload of the processor,
wherein the branch classification unit is configured to, in response to detecting a branch instruction, classify the branch instruction by:
extracting an index from an instruction address of the detected branch instruction;
extracting a tag from the instruction address of the detected branch instruction;
using the tag to determine whether at least one of the one or more entries of the BCT corresponds to the detected branch instruction;
in response to detecting that at least one of the one or more entries of the BCT corresponds to the detected branch instruction:
determining a branch type of the detected branch based on a branch type field of the at least one entry,
predicting, by the branch predictor, an outcome of the detected branch instruction;
executing, by the processor pipeline, the detected branch instruction;
updating the BCT based on an actual behavior and a predicted behavior of the branch instruction using one or more of the following rules:
decrement a value in a correct prediction counter field of the BCT by 1 if a predicted branch direction matches an actual branch direction, or
decrement a value in a misprediction field of the BCT by 1 if a predicted branch direction does not match an actual branch direction,
wherein the branch classification unit is further configured to:
determine whether a value in at least one of the correct prediction counter field or the misprediction counter field is zero;
classify the branch instruction, in response to determining that the value in at least one of the correct prediction counter field or the misprediction field is zero, based on the following rules:
classify the branch instruction as HTP if the value of the misprediction field is zero, or classify the branch instruction as simple if the value of the correct prediction counter field is zero and the value of the misprediction field is greater than zero; and update a branch type field of the BCT based on the classification, and update a usefulness bits field of the BCT based on the classification.

2. The processor of claim 1, wherein the one or more entries of the BCT are organized as a 2-way set-associative table.

3. The processor of claim 1, wherein each of the one or more entries of the BCT further include one or more of the following fields: a tag field, a correct prediction counter field, a misprediction field, a branch type field, and a usefulness bits field.

4. The processor of claim 3, wherein the threshold determination module is configured to adjust a value of the correct prediction counter field of the BCT.

5. The processor of claim 1, further comprising, in response to determining that at least one of the one or more entries of the BCT does not correspond to the detected branch instruction:

create a new entry in the BCT corresponding to the branch instruction; and assign the branch instruction a branch type of simple branch.

6. The processor of claim 5, wherein the creation is performed only if one or more of the following conditions are satisfied: the branch instruction is mispredicted or at least one of the one or more entries of the BCT have a usefulness bits field value of 0.

7. The processor of claim 4, wherein the threshold determination module is configured to adjust a value of the correct prediction counter field of the BCT by:

determining whether a predetermined number of instructions have been received by the processor pipeline;

upon determining that predetermined number of instructions have been received by the processor pipeline, comparing a threshold value to a ratio of a stream count to a misprediction count;

updating the value of a reset correct prediction counter field of the threshold determination module based on the comparison; and using the value of the reset correct prediction counter field of the threshold determination module to adjust the value of the correct prediction counter field of the BCT, wherein the stream count is a number of branch instructions classified as HTP by the BCT, and the misprediction count is a number of times an actual behavior of a branch instruction does not match the predicted behavior of the branch instruction.

8. The processor of claim 7, wherein updating the value of a reset correct prediction counter field of the threshold determination module based on the comparison comprises:

incrementing the value of the reset correct prediction counter field of the threshold determination module by 1 if the ratio is less than the threshold value; or decrementing value of the reset correct prediction counter field of the threshold determination module by 1 if the ratio is greater than or equal to the threshold value.

9. The processor of claim 7, wherein the threshold value is dynamically calculated based on one or more factors corresponding to the workload of the processor selected from the following: number of mispredictions, number of instructions received per cycle (IPC), number of instructions executed per cycle, the dispatch to complete ratio for the instructions, execution unit utilization factor, domain served, applications, real estate availability, power budget, or desired processing times.

10. A method for classifying a branch instruction, the method comprising:

detecting, at a processor, a branch instruction;

extracting an index from an instruction address of the branch instruction;

using the index to determine whether at least one of one or more entries in a branch classification table (BCT) corresponds to the detected branch instruction; and in response to detecting that at least one of the one or more entries of the BCT corresponds to the detected branch instruction, determining a branch type of the detected branch based on a branch type field of the at least one entry;

predicting, by a branch predictor, an outcome of the detected branch instruction;

executing, by a processor pipeline, the detected branch instruction;

updating the BCT based on an actual behavior and a predicted behavior of the branch instruction using one or more of the following rules:

decrement a value in a correct prediction counter field of the BCT by 1 if a predicted branch direction matches an actual branch direction, or decrement a value in a misprediction field of the BCT by 1 if a predicted branch direction does not match an actual branch direction, further comprising adjusting a value of a correct prediction counter field of the BCT by:

determining whether a predetermined number of instructions have been received by the processor pipeline;

upon determining that the predetermined number of instructions have been received by the processor pipeline, comparing a threshold value to a ratio of a stream count to a misprediction count;

updating the value of a reset correct prediction counter field of the threshold determination module based on the comparison; and using the value of the reset correct prediction counter field of the threshold determination module to adjust the value of the correct prediction counter field of the BCT, wherein the stream count is a number of branch instructions classified as HTP by the BCT, and the misprediction count is a number of times an actual behavior of a branch instruction does not match the predicted behavior of the branch instruction.

11. A processor comprising:

a processor pipeline comprising one or more execution units configured to execute branch instructions;

a branch predictor associated with the processor pipeline and configured to predict a branch instruction outcome; and a branch classification unit associated with the processor pipeline and the branch prediction unit, and configured to, in response to detecting a branch instruction, classify the branch instruction as at least one of the following: a simple branch or a hard-to-predict (HTP) branch, wherein a threshold used for the classification is dynamically adjusted based on a workload of the processor, wherein the branch classification unit comprises:

a branch classification table (BCT) including one or more entries, wherein each of the one or more entries includes one or more fields configured to record an actual behavior and a predicted behavior of a branch instruction; and a threshold determination module configured to adjust a value of at least one of the one or more fields of the BCT based on the workload of the processor, wherein the branch classification unit is configured to, in response to detecting a branch instruction, classify the branch instruction by:

extracting an index from an instruction address of the detected branch instruction;

extracting a tag from the instruction address of the detected branch instruction;

using the tag to determine whether at least one of the one or more entries of the BCT corresponds to the detected branch instruction;

in response to detecting that at least one of the one or more entries of the BCT corresponds to the detected branch instruction:

determining a branch type of the detected branch based on a branch type field of the at least one entry, further comprising, in response to determining that at least one of the one or more entries of the BCT does not correspond to the detected branch instruction:

create a new entry in the BCT corresponding to the branch instruction; and assign the branch instruction a branch type of simple branch, wherein the creation is performed only if one or more of the following conditions are satisfied: the branch instruction is mispredicted or at least one of the one or more entries of the BCT have a usefulness bits field value of 0.

12. The processor of claim 11, wherein the one or more entries of the BCT are organized as a 2-way set-associative table.

13. The processor of claim 11, wherein each of the one or more entries of the BCT further include one or more of the following fields: a tag field, a correct prediction counter field, a misprediction field, a branch type field, and a usefulness bits field.

14. The processor of claim 13, wherein the threshold determination module is configured to adjust a value of the correct prediction counter field of the BCT.

15. The processor of claim 11, further comprising, in response to determining that at least one of the one or more entries of the BCT correspond to the detected branch instruction:

predicting, by the branch predictor, an outcome of the detected branch instruction;

executing, by the processor pipeline, the detected branch instruction;

updating the BCT based on an actual behavior and a predicted behavior of the branch instruction using one or more of the following rules:

decrement a value in a correct prediction counter field of the BCT by 1 if a predicted branch direction matches an actual branch direction, or decrement a value in a misprediction field of the BCT by 1 if a predicted branch direction does not match an actual branch direction.

16. The processor of claim 15, wherein the branch classification unit is further configured to:

determine whether a value in at least one of the correct prediction counter field or the misprediction counter field is zero;

classify the branch instruction, in response to determining that the value in at least one of the correct prediction counter field or the misprediction field is zero, based on the following rules:

classify the branch instruction as HTP if the value of the misprediction field is zero, or classify the branch instruction as simple if the value of the correct prediction counter field is zero and the value of the misprediction field is greater than zero; and update a branch type field of the BCT based on the classification.

17. The processor of claim 16, wherein the branch classification unit is further configured to update a usefulness bits field of the BCT based on the classification.

18. The processor of claim 14, wherein the threshold determination module is configured to adjust a value of the correct prediction counter field of the BCT by:

determining whether a predetermined number of instructions have been received by the processor pipeline;

upon determining that predetermined number of instructions have been received by the processor pipeline, comparing a threshold value to a ratio of a stream count to a misprediction count;

updating the value of a reset correct prediction counter field of the threshold determination module based on the comparison; and using the value of the reset correct prediction counter field of the threshold determination module to adjust the value of the correct prediction counter field of the BCT, wherein the stream count is a number of branch instructions classified as HTP by the BCT, and the misprediction count is a number of times an actual behavior of a branch instruction does not match the predicted behavior of the branch instruction.

19. The processor of claim 18, wherein updating the value of a reset correct prediction counter field of the threshold determination module based on the comparison comprises:

incrementing the value of the reset correct prediction counter field of the threshold determination module by 1 if the ratio is less than the threshold value; or decrementing value of the reset correct prediction counter field of the threshold determination module by 1 if the ratio is greater than or equal to the threshold value.

20. The processor of claim 18, wherein the threshold value is dynamically calculated based on one or more factors corresponding to the workload of the processor selected from the following: number of mispredictions, number of instructions received per cycle (IPC), number of instructions executed per cycle, the dispatch to complete ratio for the instructions, execution unit utilization factor, domain served, applications, real estate availability, power budget, or desired processing times.

* * * * *